(12) United States Patent
Lin

(10) Patent No.: US 9,426,925 B2
(45) Date of Patent: Aug. 23, 2016

(54) CONTAINER DATA CENTER

(71) Applicant: HON HAI PRECISION INDUSTRY CO., LTD., New Taipei (TW)

(72) Inventor: Tai-Wei Lin, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 842 days.

(21) Appl. No.: 13/709,074

(22) Filed: Dec. 10, 2012

(65) Prior Publication Data

US 2014/0120824 A1    May 1, 2014

(30) Foreign Application Priority Data

Oct. 29, 2012    (TW) .............................. 101139880 A

(51) Int. Cl.
*H05K 5/02* (2006.01)
*H05K 7/14* (2006.01)
*H05K 7/20* (2006.01)

(52) U.S. Cl.
CPC ........ *H05K 7/1497* (2013.01); *H05K 7/20736* (2013.01); *H05K 7/20836* (2013.01)

(58) Field of Classification Search
None
See application file for complete search history.

(56) References Cited

U.S. PATENT DOCUMENTS

| | | | | |
|---|---|---|---|---|
| 1,877,050 | A * | 9/1932 | Rembert | A47F 1/12 221/130 |
| 3,404,931 | A * | 10/1968 | Fall | A47B 47/03 312/265.4 |
| 5,345,351 | A * | 9/1994 | Krohn | G11B 33/027 360/96.51 |
| 5,557,499 | A * | 9/1996 | Reiter | G06F 1/184 312/223.2 |
| 6,364,439 | B1 * | 4/2002 | Cedillo | G06F 1/18 211/26 |
| 7,432,441 | B2 * | 10/2008 | Liang | H05K 7/1411 174/17 VA |
| 7,508,683 | B1 * | 3/2009 | Jochym | H05K 9/0062 361/816 |
| 7,971,446 | B2 * | 7/2011 | Clidaras | G06F 1/20 62/259.2 |
| 8,615,328 | B2 * | 12/2013 | Tan | G05D 23/1934 340/544 |
| 2001/0037985 | A1 * | 11/2001 | Varghese | A47B 88/044 211/26 |
| 2005/0157461 | A1 * | 7/2005 | Cauthron | H05K 7/1488 361/724 |
| 2006/0082263 | A1 * | 4/2006 | Rimler | B60P 3/14 312/201 |
| 2006/0158842 | A1 * | 7/2006 | McAnally | G06F 1/183 361/679.33 |
| 2010/0139887 | A1 * | 6/2010 | Slessman | F28F 9/0265 165/67 |
| 2011/0250831 | A1 * | 10/2011 | Huang | H05K 7/20745 454/184 |
| 2011/0291852 | A1 * | 12/2011 | Forristal | H05K 7/186 340/686.1 |
| 2015/0208554 | A1 * | 7/2015 | Leigh | G06F 1/20 165/80.3 |

FOREIGN PATENT DOCUMENTS

| | | |
|---|---|---|
| TW | 201224374 | 6/2012 |
| TW | M436818 | 9/2012 |
| TW | 201242225 | 10/2012 |

* cited by examiner

*Primary Examiner* — Gregory Huson
*Assistant Examiner* — Martha Becton
(74) *Attorney, Agent, or Firm* — ScienBiziP, P.C.

(57) ABSTRACT

A container data center includes a container, a cooling room defined in the container, and a cabinet receiving a server. The cabinet includes a fan module opposite to the cooling room. An opening is defined in the cabinet. A box is attached to the cabinet. The box defines an inlet. A blocking plate is pivotably attached to the box to cover or uncover the inlet. An air plate is pivotably attached to the cabinet to cover or uncover the opening. When the server is moved into the cabinet through the inlet, the server pushes the corresponding blocking plate and the corresponding air plate to rotate. When the cabinet operates, the fan module operates to exhaust hot air from the cabinet, the cabinet then becomes negative pressure rooms to let the cooling air enter the cooling room through the inlet and the opening.

4 Claims, 4 Drawing Sheets

CONTAINER DATA CENTER

BACKGROUND

1. Technical Field

The present disclosure relates to a container data center.

2. Description of Related Art

With increasing use of online applications, the need for computer data centers has increased rapidly. Data centers are centralized computing facilities that include many cabinets. During operation, server systems generate a great amount of heat in the data centers. A common method for dissipating the heat is to define a cooling room, which is cooled by an air-conditioning device. The cooling room cools the cabinets by air conditioners and fans. However, the cooling room cannot supply different cooling airflow according to the different needs of the cabinets.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

The disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
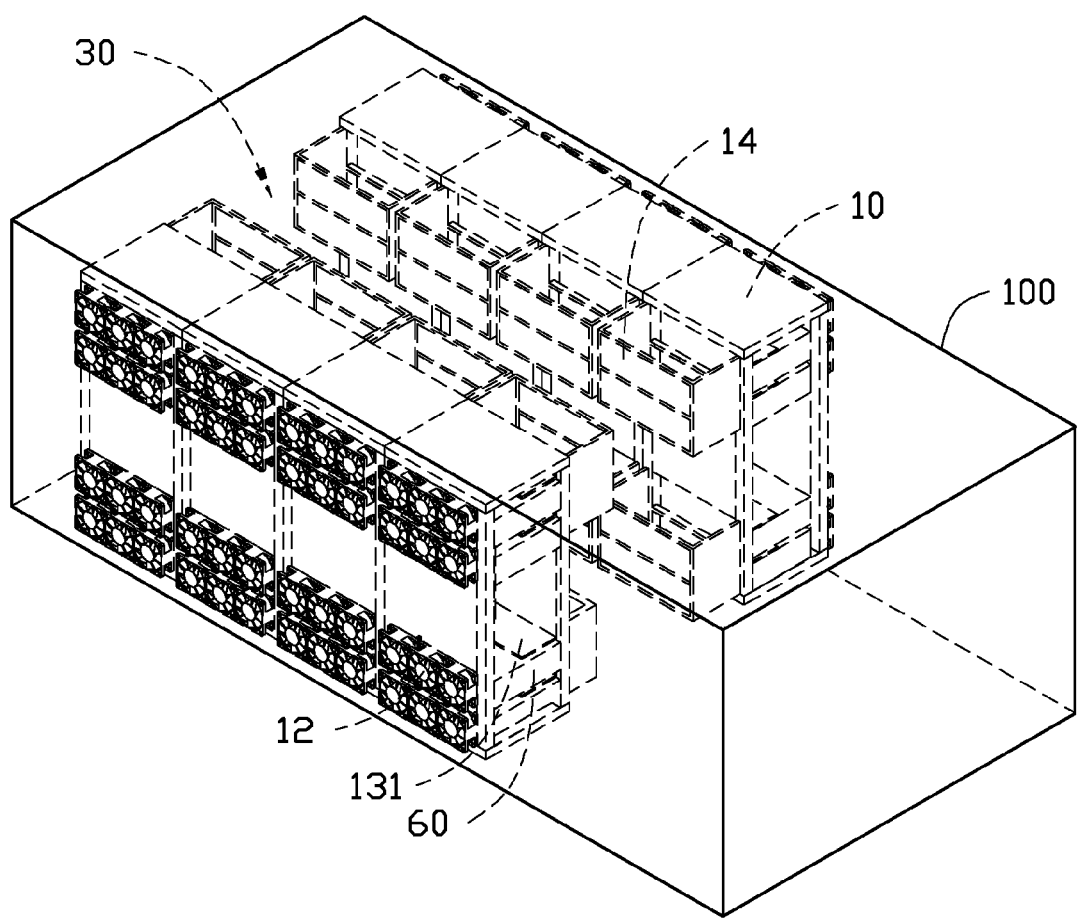
FIG. 1 is a schematic, isometric view of a container data center, according to an exemplary embodiment, wherein the container data center includes a cabinet.
Figure 2:
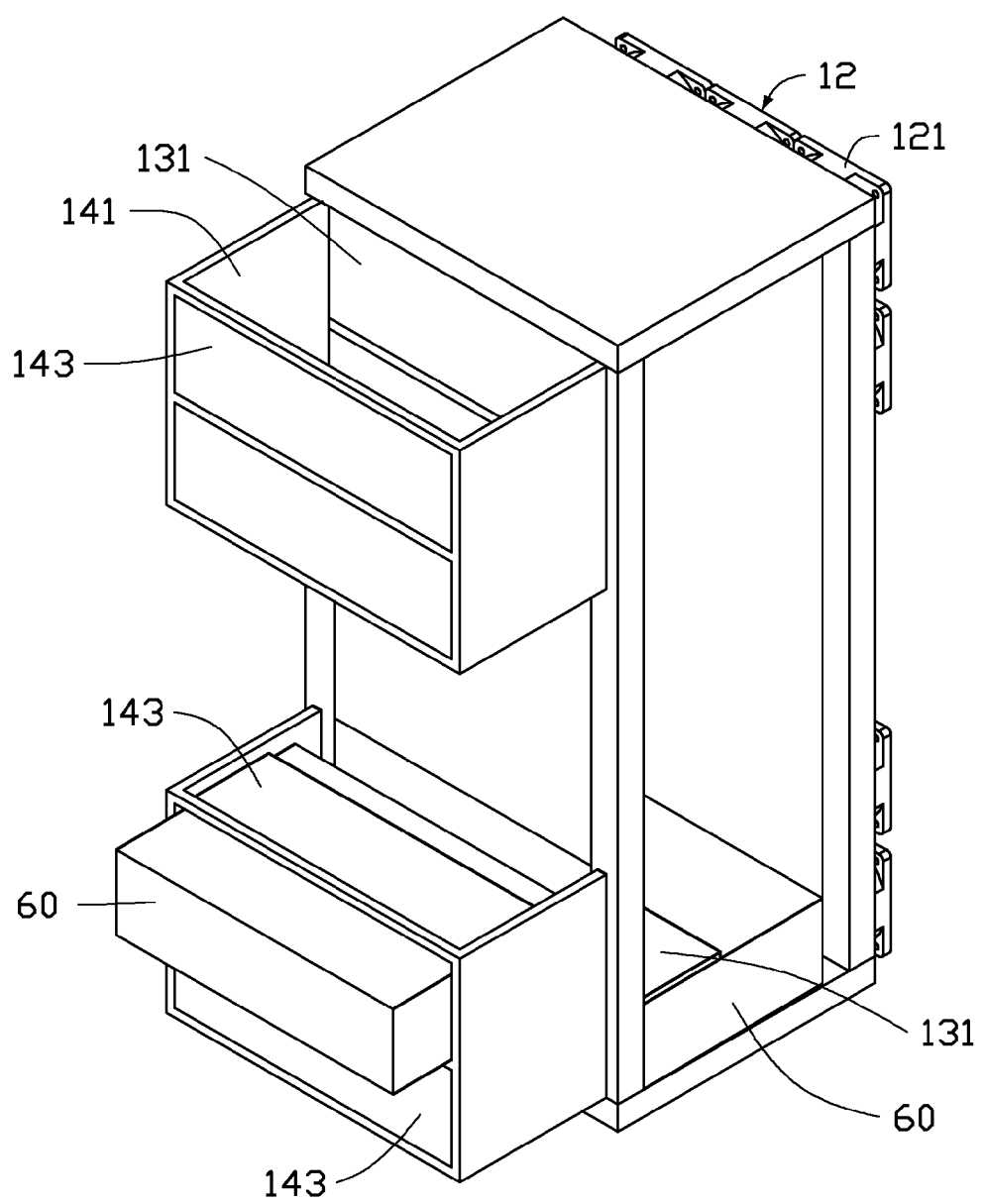
FIG. 2 is an enlarged view of the cabinet of FIG. 1.

Referring to FIG. 1 and FIG. 2, an embodiment of a container data center includes a container 100, and two rows of cabinets 10 arranged in the container 100. Each cabinet 10 receives a plurality of servers 60.

The container 100 includes a cooling room 30 connected to an air-conditioning device. The cooling room 30 is located between the rows of cabinets 10.

Figure 3:
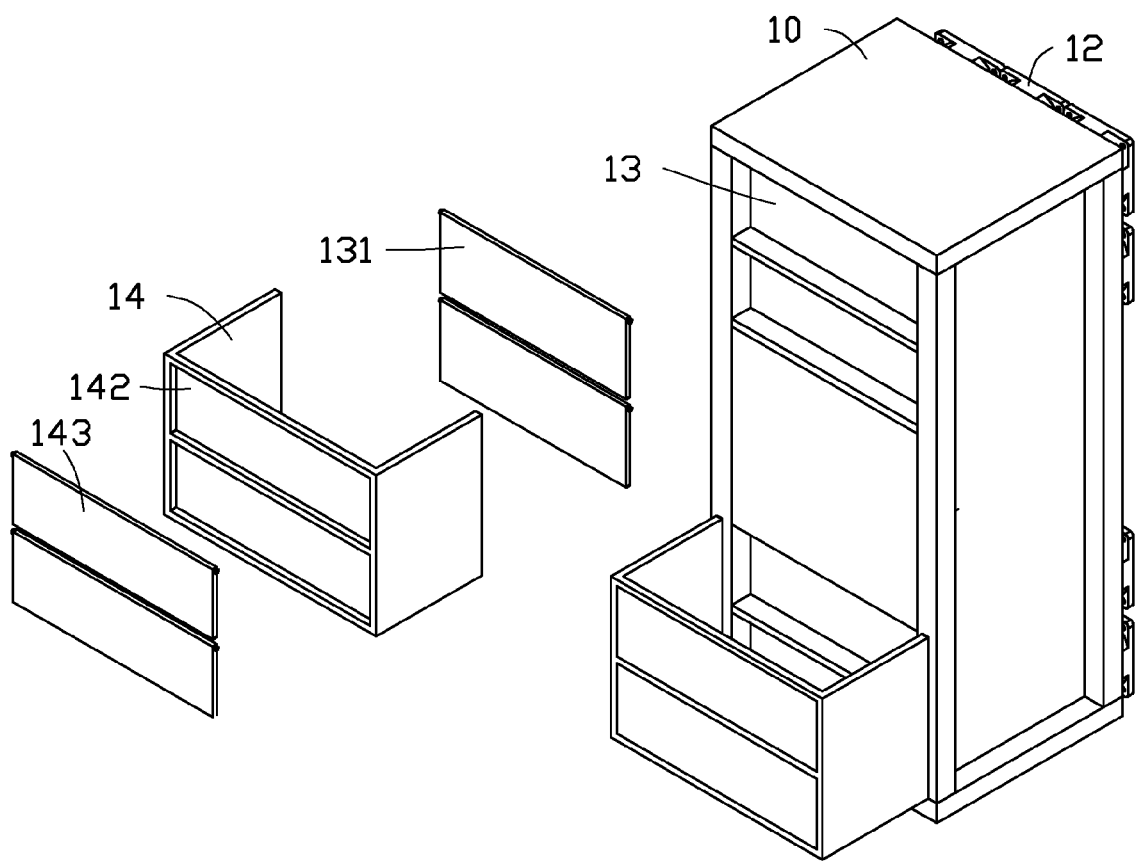
FIG. 3 is a partial, exploded view of the cabinet of FIG. 2.

Referring to FIG. 2 and FIG. 3, each cabinet 10 includes two fan modules 12 respectively attached to an upper portion and a lower portion of a first side of the cabinet 10 opposite to the cooling room 30. Each fan module 12 includes a plurality of fans 121. Two opening 13 are defined in a second side of the cabinet 10 facing the cooling room 30, aligning with each fan module 12. An air plate 131 is pivotably attached to the second side of the cabinet 10 at a top of each opening 13, to cover or uncover the each opening 13. Two boxes 14 are mounted to the second side of the cabinet 10, aligning with the openings 13 respectively. An air inlet 141 is defined in a top of each box 14. Two inlets 142 are defined in a side of each box 14, aligning with the openings 13. A blocking plate 143 is pivotably attached to the side of the box 14 at a top of each inlet 142, to cover or uncover the each inlet 142.

When a server 60 is inserted into the cabinet 10 through the inlet 142, the server 60 pushes the corresponding blocking plate 143 and the corresponding air plate 131 to rotate up for 90 degrees in that order. After the server 60 is completely inserted into the cabinet 10, the corresponding air plate 131 is rested on a top of the server 60. The blocking plate 143 is rotated back to cover the inlet 142.

Figure 4:
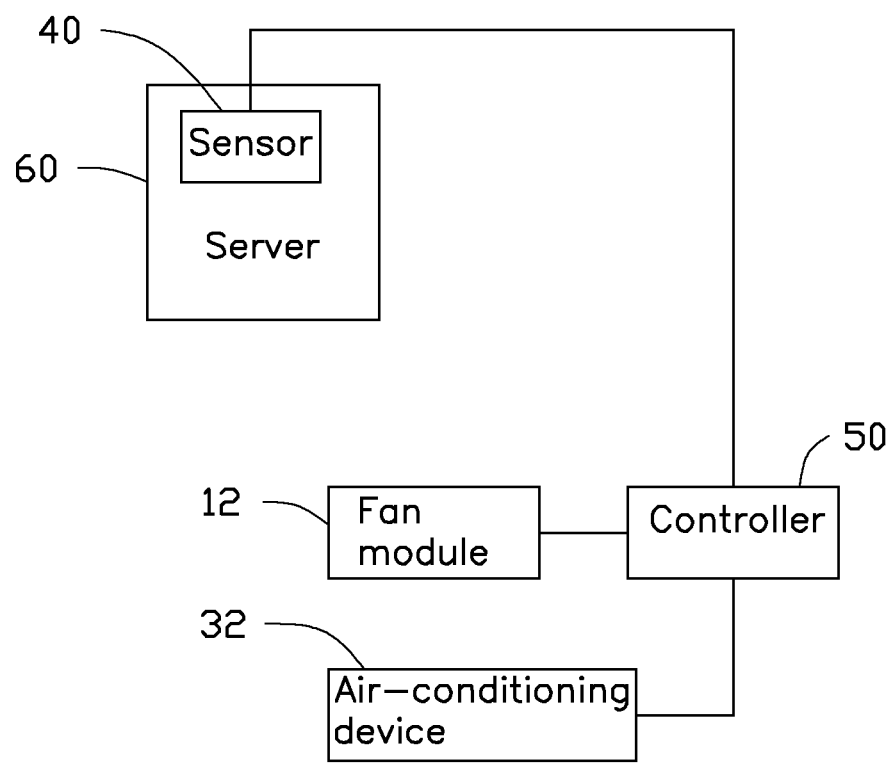
FIG. 4 is a partially block diagram of the container data center of FIG. 1.

Referring to FIG. 4, when the cabinets 10 operate, the fan modules 12 operate to exhaust hot air from the cabinets 10. The cabinets 10 then become negative pressure rooms to let the cooling air in the cooling room 30 enter the servers 60 through the air inlets 141 and the opening 13, and in that order. When no server 60 is received in the opening 13, the air plate 131 covers the corresponding opening 13, for preventing cooling air consumption.

A sensor 40 is arranged in each server 60. The sensors 40 senses the temperature in the servers 60 to generate temperature signals and transmit the temperature signals to a controller 50. When the controller 50 receives a high temperature signal, the controller 50 will speed up the fan modules 12 of the cabinet 10, to let more cooling air of the cooling room 30 enter the corresponding servers 60.

In other embodiment, the air inlets 141 can be connected to another air-conditioning device 32, for supplying cooling air to the servers 60 directly. Thus, the cooling room 30 can maintain a comfortable temperature for operators entering the container 100.

In the embodiment, the fan modules 12 are mounted on one side of the cabinets 10 to exhaust hot air from the cabinets 10. The cabinets 10 then become negative pressure rooms to let the cooling air in the cooling room 30 enter the cabinets 10 to cool the cabinets 10. The speed of the fan modules 12 can be adjusted to adjust the cooling airflow flowing into the cabinets 10, which can supply different cooling airflow according to the different needs of the cabinets 10. The air plates 131 can cover the corresponding opening 13 without receiving a server, for preventing cooling air consumption.

Even though numerous characteristics and advantages of the embodiments have been set forth in the foregoing description, together with details of the structure and function of the embodiments, the disclosure is illustrative only, and changes may be made in detail, especially in the matters of shape, size, and arrangement of parts within the principles of the present disclosure to the full extent indicated by the broad general meaning of the terms in which the appended claims are expressed.

What is claimed is:

1. A container data center, comprising:
   a container;
   a cooling room defined in the container; and
   a cabinet for receiving a server, and arranged in the container beside the cooling room;
   wherein the cabinet comprises a fan module attached to a first side of the cabinet opposite to the cooling room, to exhaust hot air from the cabinet, an opening is defined in a second side of the cabinet facing the cooling room, and a box is attached to the second side of the cabinet and aligns with the opening, the box defines an inlet aligning with the opening and an air inlet, a blocking plate is pivotably attached to the box to cover or uncover the inlet, an air plate is pivotably attached to the second side of the cabinet to cover or uncover the opening, the blocking plate and the corresponding air plate are rotatable to allow the server to be pushed from the inlet to the opening to enter to the cabinet, after the server enters the cabinet completely, the corresponding air plate is rested on a top of the server, the blocking plate is rotated back to cover the inlet; and wherein the fan module configured to exhaust hot air from the cabinet, the cabinet then becomes negative pressure rooms to let the cooling air in the cooling room enter the server through the air inlet and the opening in that order.

2. The container data center of claim 1, further comprising an air-conditioning device connected to the air inlet.

3. The container data center of claim 1, wherein the fan module comprises a plurality of fans.

4. The container data center of claim 1, wherein a sensor is arranged in the server, the sensor senses temperature in the server to generate temperature signals and transmits the temperature signals to a controller, the controller controls speeds of the fan module.

\* \* \* \* \*